United States Patent [19]
Greenberg

[11] Patent Number: 6,140,710
[45] Date of Patent: Oct. 31, 2000

[54] POWER AND GROUND AND SIGNAL LAYOUT FOR HIGHER DENSITY INTEGRATED CIRCUIT CONNECTIONS WITH FLIP-CHIP BONDING

[75] Inventor: Lawrence Arnold Greenberg, Allentown, Pa.

[73] Assignee: Lucent Technologies Inc., Murray Hill, N.J.

[21] Appl. No.: 09/305,732

[22] Filed: May 5, 1999

[51] Int. Cl.[7] ........................... H01L 23/48; H01L 23/52; H01L 29/40
[52] U.S. Cl. ............................................. 257/786; 257/778
[58] Field of Search ..................................... 257/786, 784, 257/780, 781, 778, 773

[56] References Cited

U.S. PATENT DOCUMENTS

5,952,726  9/1999  Liang .
5,969,417  10/1999  Yamashita et al. .
5,986,346  11/1999  Katoh .
6,049,136  4/2000  Humphrey et al. .
6,057,596  5/2000  Lin et al. .
6,064,113  5/2000  Kirkman .

*Primary Examiner*—Sheila V. Clark
*Attorney, Agent, or Firm*—Mark Kurisko

[57] ABSTRACT

An integrated circuit package including a die housing an integrated circuit and having a plurality of electrical contact pads on a surface of the die. The electrical contact pads include energizing contact pads for connecting power and ground lines to the integrated circuit, and include data contact pads. The energizing contact pads lie along the path of intersecting first and second directional lines. The intersecting directional lines define four quadrants on the surface of the die, each quadrant containing at least one data contact pad.

12 Claims, 7 Drawing Sheets

POWER AND GROUND AND SIGNAL LAYOUT FOR HIGHER DENSITY INTEGRATED CIRCUIT CONNECTIONS WITH FLIP-CHIP BONDING

FIELD OF THE INVENTION

This invention relates to improved apparatus and methods for packaging an integrated circuit. Particularly, the invention concerns apparatus and methods for increasing the density of electrical connections to an integrated circuit.

BACKGROUND OF THE INVENTION

Integrated circuits are typically housed within a package adapted for mounting to a printed circuit board. Exemplary packages include "flip-chip" packages and multi-chip module circuit packages fabricated with electric tapes. Flip-chip packages prove particularly valuable because they efficiently utilize space when employed with very large scale integrated (VLSI) circuits.

Flip-chip packages include a die and a plurality of contact pads located on a surface of the die. The die forms an integrated circuit. The integrated circuit is electrically coupled with the contact pads located on the surface of the die via electrically conductive paths. The contact pads can form an array of contact pads that cover the surface of the die. In addition, the contact pads on the surface of the die can be generally divided into two types: energizing contact pads for powering and grounding the integrated circuit; and data contact pads for transmitting to and receiving data from the integrated circuit.

Figure 6:
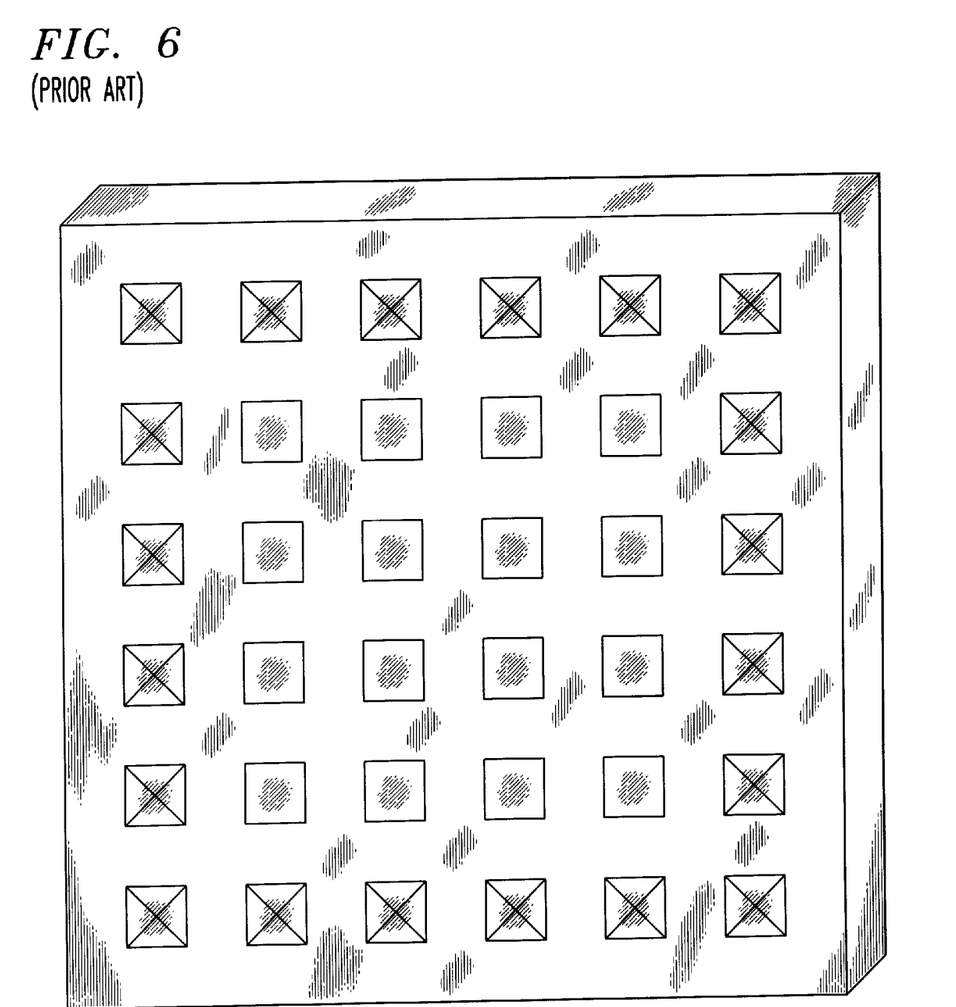
FIG. 6 is an illustration of a prior art contact pad layout on a die.

FIG. 6 shows the bottom surface of a die and the typical arrangement of contact pads on the die. The array of contact pads on the surface of the die are illustrated as an array of boxes. The energizing contact pads, indicated by a box with an "X" inside, are positioned along the outer-most row of the array of contact pads. Accordingly, the data contact pads are located within a frame of power and ground contact pads.

Figure 7:
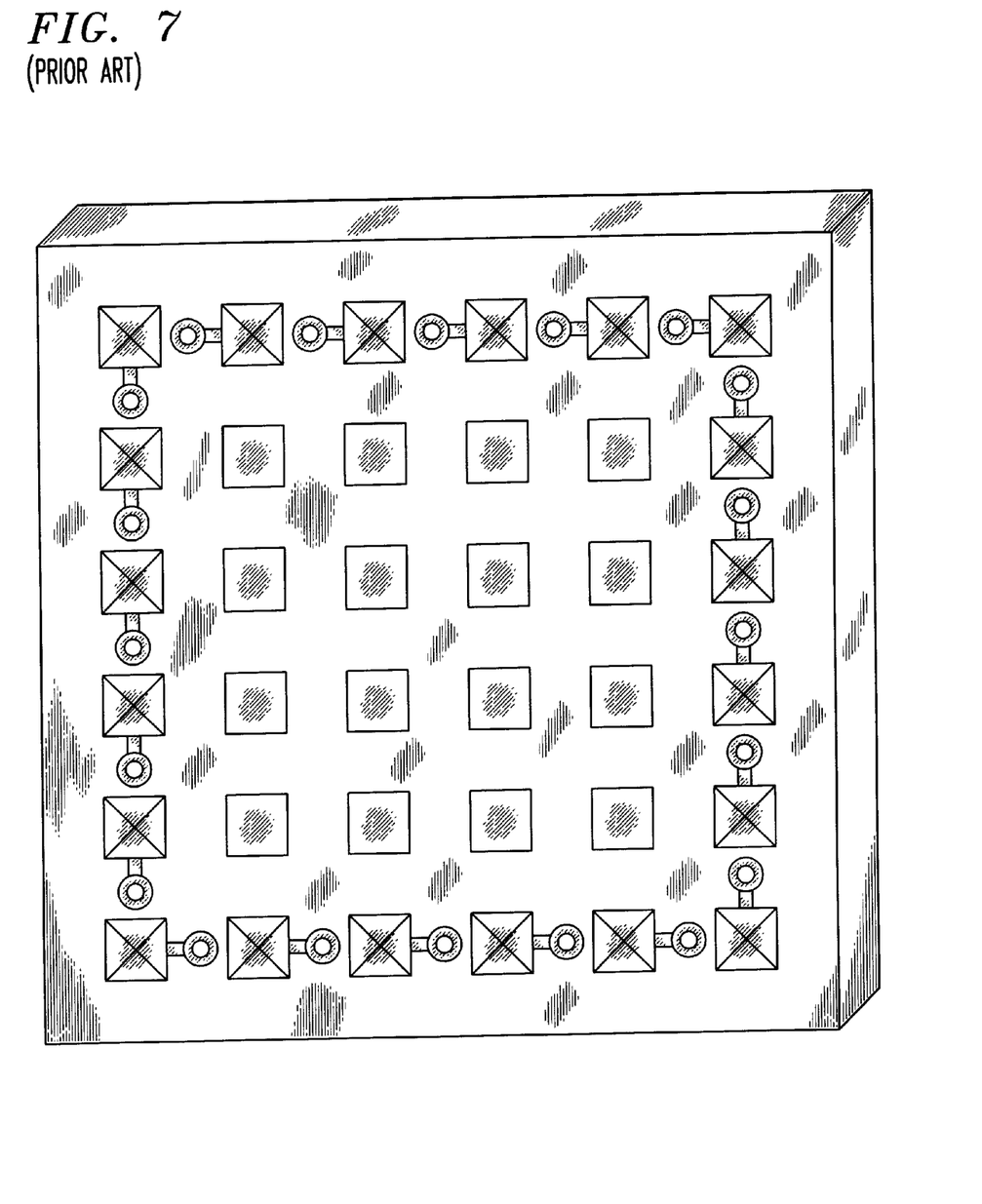
FIG. 7 illustrates a prior art contact pad layout on a substrate.

Flip-chip packages can also include a substrate. FIG. 7 illustrates the top surface of a substrate for mounting to the bottom surface of the die shown in FIG. 6. The substrate has a plurality of mating contact pads positioned on the top surface of the substrate. The die can be mounted and electrically coupled to a substrate by aligning and connecting the contact pads on the die with the mating contact pads on the substrate. Typically, solder balls are soldered between the contact pads on the die and the mating contact pads on the substrate to connect the die and the substrate.

The mating contact pads on the substrate include energizing contact pads and data contact pads. The mating contact pads on the surface of the FIG. 7 substrate are illustrated as an array of boxes. The energizing contact pads on the substrate are indicated with a box having an "X" inside. The substrate's energizing contact pads are positioned so that they align with the energizing contact pads on the bottom surface of the die shown in FIG. 6.

The substrate can also include external connectors, such as connecting pins or solder balls, located on another surface of the substrate. One end of each of the external connectors is internally connected, through electrical routing paths within the substrate, to the mating contact pads on the substrate. The other end of each of the external connectors is electrically coupled to conductive paths in a printed circuit board. This configuration electrically couples the integrated circuit of the flip-chip package with the printed circuit board.

The substrate is typically a multi-layered structure that provides paths for fanning out all the electrical connections from the die to the external connectors of the substrate. The substrate also includes vias that route signals between the layers of the substrate. The FIG. 7 vias are illustrated as circles that are connected to the energizing contact pads by electrically conductive paths on the substrate surface. One via is connected to each energizing contact pad. The energizing pad and via combination utilizes space along the edge of the substrate, thereby inhibiting the ability of data lines to reach the edge of the substrate.

For many integrated circuits, the size of the die in a flip-chip package is determined by the density of connections to the integrated circuit housed within the die. In the current design of flip-chip packages, the contact pads are not structured or positioned in an order that maximizes the density of connections to the die.

Accordingly, there is a need for a flip-chip package having contact pads structured in a manner that increases the density of data line connections along the edge of the substrate.

SUMMARY OF THE INVENTION

Data line connections along the edge of a substrate are increased, according to the invention, by distributing energizing contact pads (i.e. the power and ground pads) along the path of first and second intersecting directional lines. In one embodiment, according to the invention, the integrated circuit package includes a die having an integrated circuit and an array of contact pads. The integrated circuit is formed within the die and the array of contact pads are located on a surface of the die. The array of contact pads include both energizing contact pads and data contact pads. The energizing contact pads are electrically coupled to the integrated circuit housed within the die. In addition, the energizing contact pads lie along the path of intersecting first and second directional lines. The intersecting directional lines form four quadrants on the surface of the die. Each of the quadrants includes at least one data contact pad.

BRIEF DESCRIPTION OF THE DRAWINGS

The features and advantages of the invention will be apparent from the following description, as illustrated in the accompanying Figures in which like reference characters refer to the same elements throughout the different views.

DETAILED DESCRIPTION

Figure 1:
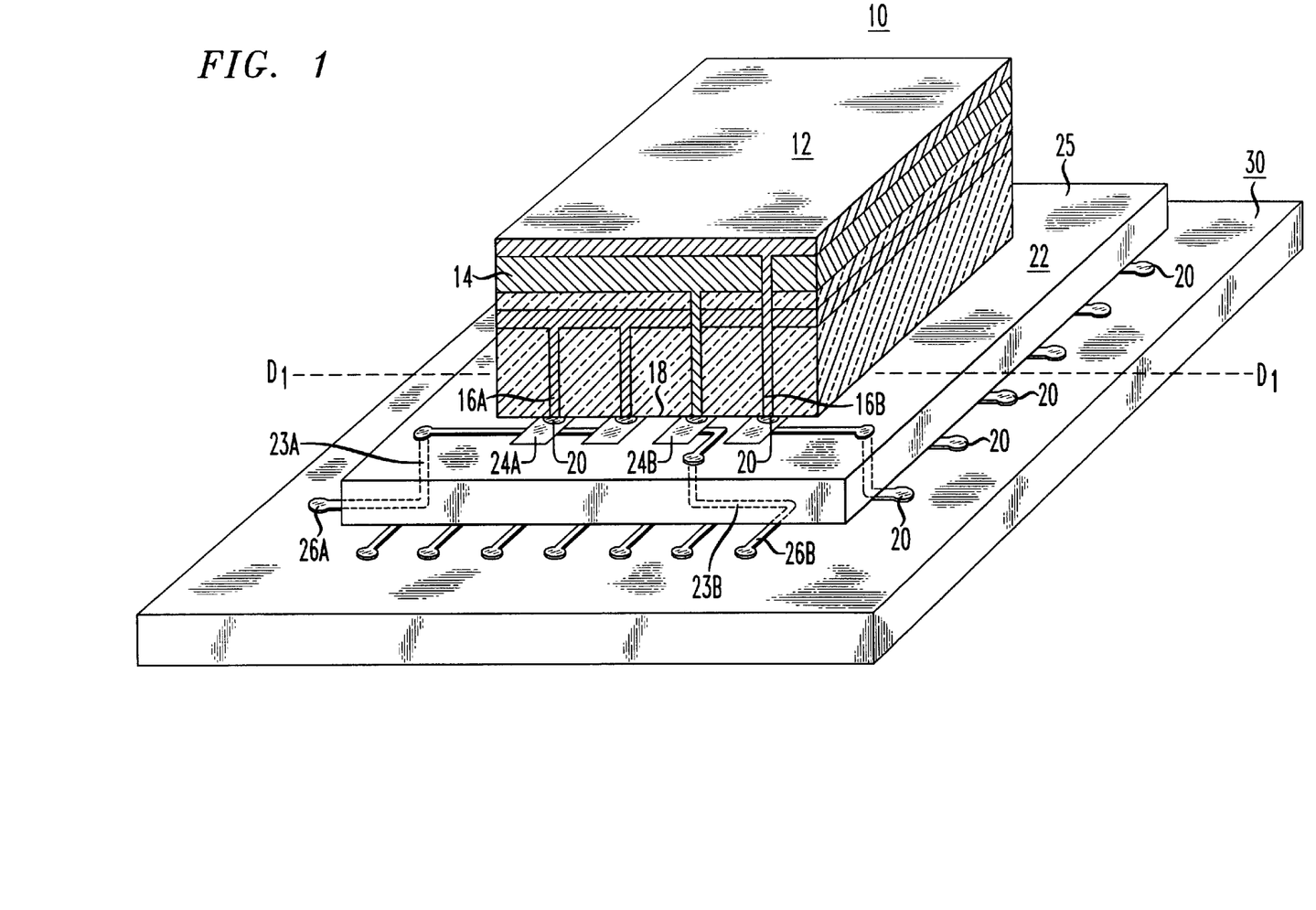
FIG. 1 is a perspective view of an integrated circuit package of the present invention.

FIG. 1 illustrates an integrated circuit package 10, according to the invention, for increasing the density of electrical connections. The integrated circuit package 10 includes a die 12 having an integrated circuit 14 formed therein. The die 12 also includes a plurality of energizing contact pads 16A, 16B located on a surface 18 of the die 12. The energizing contact pads 16A, 16B are electrically coupled to the integrated circuit 14 housed within die 12. The energizing contact pads 16A, 16B lie along and define a directional line $D_1$—$D_1$.

Energizing contact pads, according to this invention, include power and ground contact pads for electrically connecting power and ground signals to the integrated circuit housed within the die 12. According to the invention, a group of two or more ground pads define the line $D_1$, or a group of two or more power pads define the line $D_1$, or a mixture of one power pad and one ground pad will define the directional line $D_1$.

FIG. 1 further illustrates a substrate 22 having external connectors 26A, 26B and having mating contact pads 24A, 24B. Electrical routing traces 23A, 23B within the substrate electrically connect the mating contact pads 24A, 24B with one end of the external connectors 26A, 26B. The mating contact pads 24A, 24B are positioned on a surface 25 of the substrate 22 and are aligned with the energizing contact pads 16A, 16B.

In one example, the substrate 22 is connected with the die 12 by electrically conductive balls 20. The balls 20 are typically soldered between the mating contact pads 24A, 24B on the substrate and the energizing contact pads 16A, 16B on the die. The conductive balls 20 can be formed from solder, conductive epoxy or other suitable material. The conductive balls 20 provide both a mechanical, thermal and an electrical coupling between the die 12 and the substrate 22.

The external connectors 26A, 26B can be pins, solder balls, or other connectors known in the art for connecting a flip-chip package to a printed circuit board. For example, in the case where pins are used as external connectors, one end of the external connectors 26A, 26B are connected with the mating contact pads 24A, 24B via the electrical routing traces 23A, 23B within the substrate. The opposing end of the external connectors 26A, 26B are connected to the printed circuit board 30. The pins can be directly mounted to the printed circuit board 30, or the pins can be mated with a corresponding socket on the printed circuit board 30.

Figure 2:
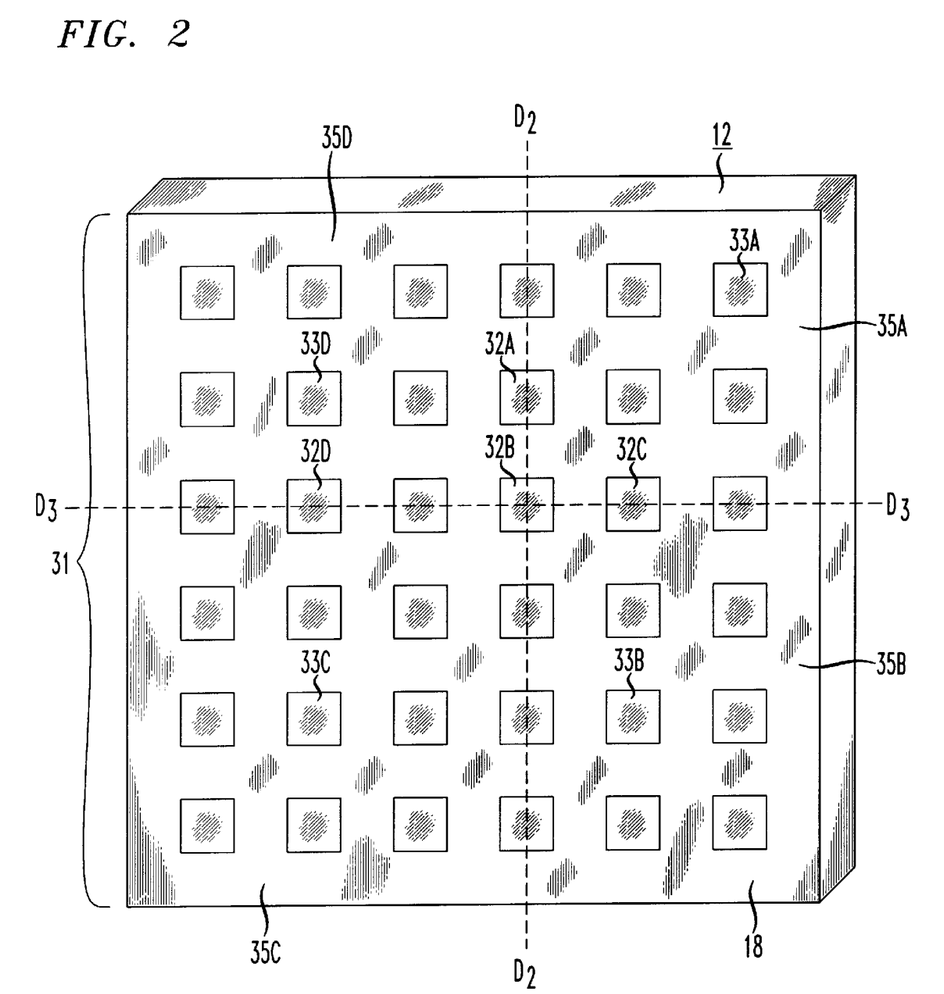
FIG. 2 is a view of the bottom surface of the die of FIG. 1.

FIG. 2 illustrates an exemplary array of contact pads 31 on the bottom surface 18 of the die 12. The illustrated array organizes the contact pads into six equally spaced columns and six equally spaced rows. The array of contact pads 31 includes at least four energizing contact pads 32A, 32B, 32C and 32D; and the array includes at least four data contact pads 33A, 33B, 33C and 33D. The energizing and the data contact pads provide electrical connections to signal paths in the integrated circuit 14 housed in die 12.

The energizing pads 32A and 32B lie along a directional line $D_2$—$D_2$, and the energizing pads 32B, 32C and 32D lie along a directional line $D_3$—$D_3$. The directional lines $D_2$—$D_2$ and line $D_3$—$D_3$ intersect within the boundaries of the die 12 such that four quadrants are formed on the surface 18 of the die. In particular, the illustrated directional lines form quadrants 35A, 35B, 35C and 35D. Each of the quadrants includes at least one data contact pad. Quadrant 35A includes data contact pad 33A, quadrant 35B includes data contact pad 33B, quadrant 35C includes data contact pad 33C, and quadrant 35D includes data contact pad 33D.

Figure 3:
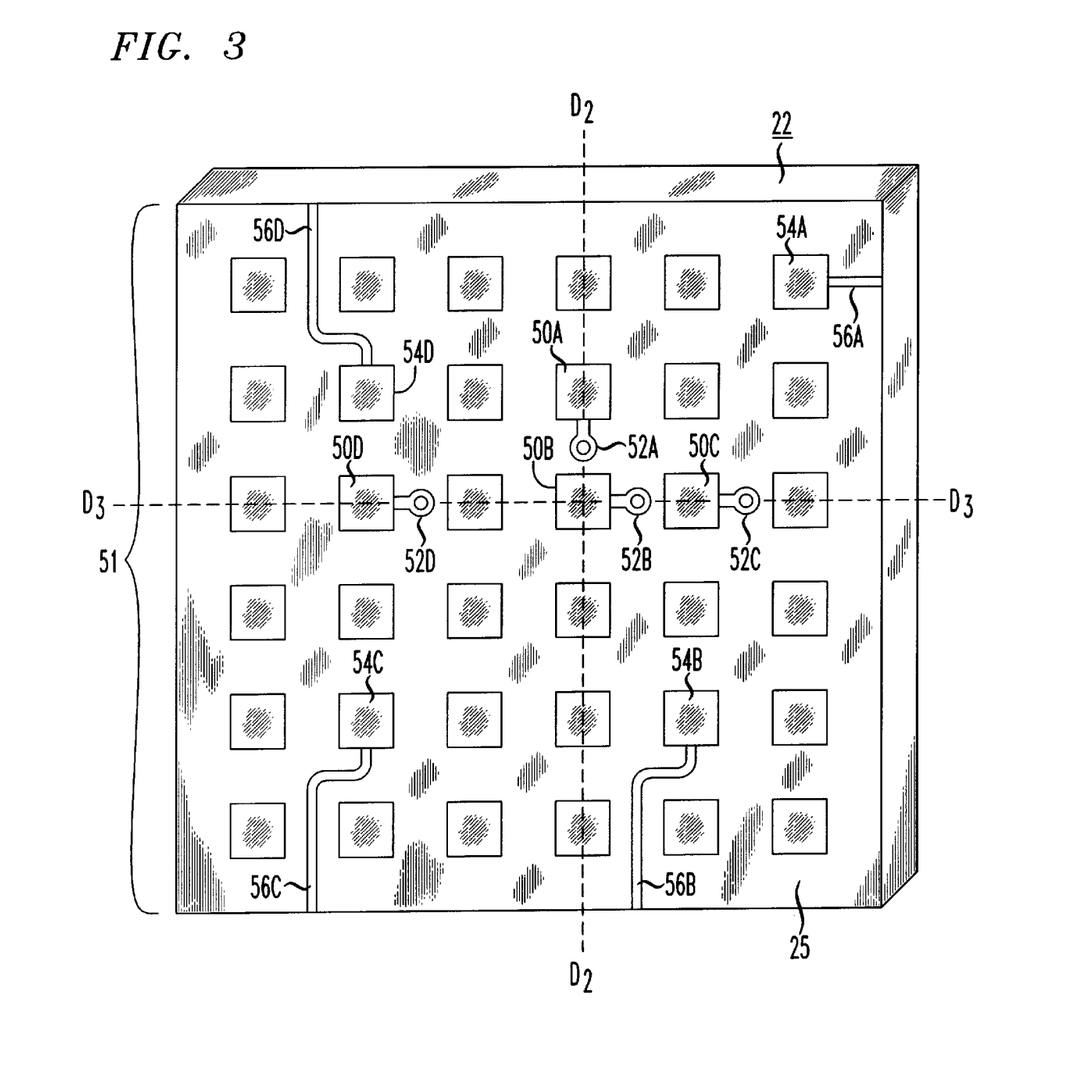
FIG. 3 is a view of the top surface of the substrate of FIG. 1.

FIG. 3 illustrates the top surface 25 of the substrate 22. The substrate 22 includes an array of mating contact pads 51 on the top surface 25 of the substrate. The illustrated array matches the array on the bottom surface of the die illustrated in FIG. 2. The array of mating contact pads 51 includes at least four energizing contact pads 50A, 50B, 50C and 50D; and the array 51 includes at least four data contact pads 54A, 54B, 54C and 54D. The mating contact pads 50A–50D on the substrate align with energizing contact pads 32A–32D on the die, and the mating contact pads 52A–52D on the substrate align with the data contact pads 33A–33C on the die.

The substrate 22 also includes vias 52A–52D that are electrically connected to energizing mating contact pads 50A–50D, respectively. The vias route the power and ground signals to other layers of substrate 22. The energizing mating contacts pads 52A and 52B lie along the directional line $D_2$—$D_2$, and the energizing mating pads 52B, 52C and 52D lie along a directional line $D_3$—$D_3$. Preferably, the vias 50A–50D also lie along one of the directional lines.

The substrate 22 illustrated in FIG. 3 also includes routing lines 56A–56D. The routing lines 56A–56D are connected to the data contact pads 54A–54D, respectively. The routing lines bring the data contact pads 54A–54D to the edge of the substrate. The illustrated configuration of the energizing pads 50A–50D, along the directional lines $D_2$—$D_2$ and $D_3$—$D_3$, frees up space along the edges of the substrate for routing lines 56A–56D.

Restricting energizing contact pads to one of the two intersecting directional lines advantageously increases the capability to connect the data contact pads to the edge of the substrate. When energizing contact pads are not restricted to the intersecting directional lines, as shown in prior art FIGS. 5 and 6, the energizing pads and their associated vias consume greater amounts of space along the edge of the substrate. When the space along the edge of the substrate is consumed by the energizing contact pads, the space available for routing data signals to the board edge is significantly reduced.

For instance, consider the extreme case where all the power and contact pads are placed along a directional line running parallel to the edge of the die, as illustrated in FIG. 6. In such a case, the power and ground contact pads on the substrate are located along the edge of the substrate, as shown in FIG. 7. Each of the power and ground contact pads typically has a via associated therewith. The power and ground pads, and their associated vias, consume most of the edge space along the edge of the substrate, as illustrated in FIG. 7. Under these circumstances, the data lines from the die can not reach the edge of the substrate without using a multilayer substrate solution. Increasing the level of connectivity for the data lines from the integrated circuit is accomplished, according to the invention, by placing the power and ground contact pads (i.e. energizing pads) along intersecting directional lines that form quadrants for the data contact pads. When the power and ground lines are so positioned, space along the edge of the die is freed for data lines, thereby increasing the number of connections per unit area to the die.

A multi-layer substrate provides the ability to route signal paths around each other by weaving the signals through the layers of the substrate. However, in order to increase the density of connections to the data lines from the integrated circuit without increasing the number of layers in the substrate, the energizing contact pads should be placed along intersecting directional lines. In accordance with the invention, when the energizing pads are so positioned, more data can access the edge of the substrate.

Accordingly, the invention advantageously reduces the consumption of space by power and ground contact pads, and their associated vias, along the edge of the substrate.

Thus, additional space is freed for the routing of data lines to and from the integrated circuit. The freed edge space for routing of data lines reduces the number of data lines that must be woven around other data, power, or ground signals, using a multilayer substrate.

FIG. 3 also illustrates another aspect of the invention wherein all energizing contact pads on the die 12 are located along the directional lines. For instance, the energizing pads 32A, 32B, 32C and 32D lie along the path of directional line $D_2$—$D_2$ or along the path of directional line $D_3$—$D_3$. None of the energizing pads are located in the quadrants 35A–35D. This aspect of the invention frees up additional space along the edge of the substrate for routing data signals.

Figure 4:
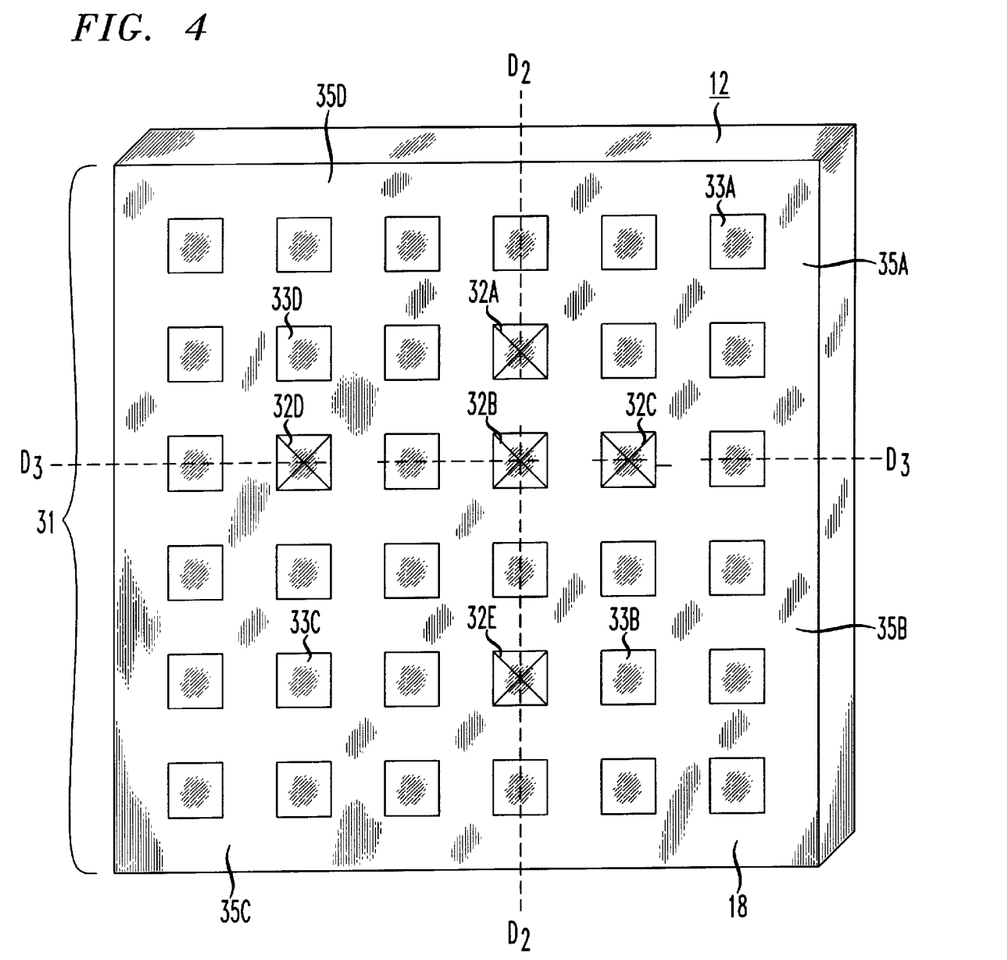
FIG. 4 is the view of the bottom surface of the die of FIG. 1 with an alternate arrangement for the energizing contact pads.

FIG. 4 shows an alternative view of the array of contact pads 31 on the bottom surface of the die 12. The array 31 includes the energizing pads 32A, 32B and 32E that lie along the directional lines $D_2$—$D_2$, and the array 31 includes the energizing pads 32B, 32C and 32D that lie along the directional line $D_3$—$D_3$. The directional lines $D_2$—$D_2$ and line $D_3$—$D_3$ intersect within the boundaries of the die 12 such that the four quadrants 35A–35D are formed on the surface 18 of the die.

In accordance with one aspect of the invention, 5%–50% of the contact pads along the length of the directional lines can be utilized for energizing contact pads. For instance, as illustrated in FIG. 3, directional line $D_2$—$D_2$ includes 6 contact pads of which 50% of the contact pads are utilized for energizing contact pads (i.e. contact pads 32A, 32B and 32E). By limiting the number of contact pads utilized as energizing contact pads along the directional lines in the die 12, the invention allows for less restrictive flow of data signals throughout a substrate 22 that is mated to the die 12. In particular, those contact pads not utilized for energizing contact pads increase the available real estate on the substrate for routing of data lines because less real estate is utilized on the substrate for vias connected to energizing contact pads.

Figure 5:
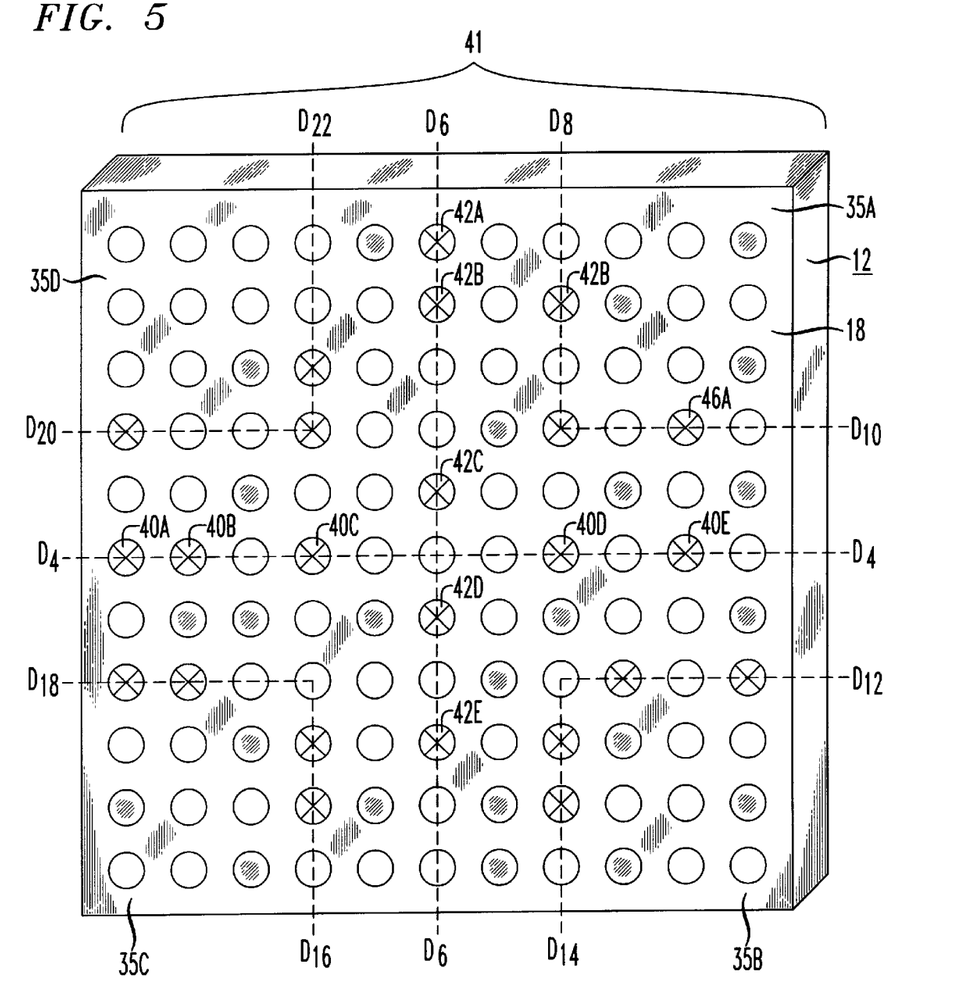
FIG. 5 is an alternative view of the bottom surface of the die of FIG. 1.

FIG. 5 illustrates an alternative view of an exemplary array of contact pads 41 on the bottom surface of the die 12. The directional line $D_4$—$D_4$ and the directional line $D_6$—$D_6$ intersect within the boundaries of the die 12 such that the four quadrants 35A–35D are formed on the surface 18 of the die. The array 41 includes the energizing pads 40A, 40B, 40C, 40D and 40E that lie along the directional lines $D_4$—$D_4$, and the array 41 includes the energizing pads 42A, 42B, 42C, 42D and 42E that lie along the directional line $D_6$—$D_6$.

The illustrated array of contact pads 41 further includes additional energizing contact pads lying along directional segments. Each directional segment is defined by at least two energizing contact pads. The energizing segments defines a path along which additional energizing contact pads are placed. For instance, additional energizing contact pads 44A and 44B define a directional segment D8, and additional energizing contact pads 46A and 44B define a directional segment D10. Preferably, 5%–50% of the contact pads lying along the path of the directional segment are devoted to energizing contact pads.

The illustrated array of contact pads 41 also includes the directional segments D12, D14, D16, D18, D20 and D22. Each of the directional segments includes energizing contact pads. The position of these energizing contact pads is illustrated by placing an "X" through the contact pads in the array.

In one aspect of the invention, the directional line $D_4$—$D_4$ and the directional line $D_6$—$D_6$ are substantially orthogonal to each other. When the directional lines are orthogonal, the area on the die available for directional segments is increased. Another preferred aspect of the invention provides for directional segments that parallel at least one of the directional lines. For instance, FIG. 4 illustrates a die 12 having segments D10, D12, D18 and D20 lying parallel to directional line $D_4$—$D_4$. The die 12 also includes segments D8, D14, D16 and D22 lying parallel to directional line $D_6$—$D_6$. When the directional segments parallel the directional lines additional space on the die, which extends to the edge of the die, is advantageously freed for the routing of data lines.

Additional features of the invention provide for directional segments that remain within the quadrants formed by the directional lines $D_4$—$D_4$ and $D_6$—$D_6$. Directional segments D8 and D10 remain within quadrant 35A, directional segments D12 and D14 remain within quadrant 35B, directional segments D16 and D18 remain within quadrant 35C, and directional segments D20 and D2 remain within quadrant 35D. By forcing the directional segments to remain within a specified quadrant additional space is provided within the specified quadrant for the routing of data lines to the edge of a substrate that is mated to die 12.

While the invention has been shown and described having reference to specific preferred embodiments, those skilled in the art will recognize that variation in form and detail may be made without departing from the spirit and scope of the invention. Thus, specific details of the disclosure herein are not intended to be necessary limitations on the scope of the invention other than as required by the prior art.

I claim:

1. An integrated circuit package, comprising:
   a die having an integrated circuit formed therein and having an array of contact pads located on a surface of the die, the array of contact pads including at least four energizing contact pads electrically coupled to the integrated circuit and including at least four data contact pads,
   wherein a first and a second energizing contact pad lie along a first directional line and a third and a fourth energizing contact pad lie along a second directional line, the first and second directional lines intersecting such that four quadrants are formed on the surface of the die, each quadrant including at least one data contact pad.

2. An integrated circuit package according to claim 1, further including:
   a substrate having mating contact pads, external connectors, and electrical routing traces located between the mating contact pads and the external connectors,
   the substrate being connected to the die such that the mating contact pads are electrically coupled to the energizing contact pads of the die.

3. An integrated circuit package according to claim 2, further including solder balls connecting the energizing contact pads to the mating contact pads on the substrate.

4. An integrated circuit package according to claim 1, wherein all the energizing contact pads on the die lie along the path of the first directional line or the second directional line.

5. An integrated circuit package according to claim 1, wherein the first and second directional lines are substantially orthogonal to each other.

6. An integrated circuit package according to claim 1, wherein 5%–50% of the contact pads lying along the path of the first directional line are energizing contact pads.

7. An integrated circuit package according to claim 6, wherein zero data pads lie along the path of the first directional line.

8. An integrated circuit package according to claim 1, wherein the energizing pads are selected from the group consisting of power pads and ground pads.

9. An integrated circuit package according to claim 1, wherein the first and second directional lines span the surface of the die.

10. An integrated circuit package according to claim 1, further including additional energizing contact pads lying along a directional segment that parallels the first directional line.

11. An integrated circuit package according to claim 10, wherein the directional segment remains within a selected quadrant formed by the first and second directional lines.

12. An integrated circuit package according to claim 10, wherein 5%–50% of the contact pads lying along the path of the directional segment are energizing contact pads.

* * * * *